United States Patent [19]

Kaneiwa et al.

[11] Patent Number: 4,799,227
[45] Date of Patent: Jan. 17, 1989

[54] SEMICONDUCTOR LASER DEVICE HAVING A BURIED HETEROSTRUCTURE

[75] Inventors: Shinji Kaneiwa; Haruhisa Takiguchi, both of Nara; Toshihiko Yoshida; Sadayoshi Matsui, both of Tenri, all of Japan

[73] Assignee: Sharp Kabushiki Kaisha, Osaka, Japan

[21] Appl. No.: 66,510

[22] Filed: Jun. 26, 1987

Related U.S. Application Data

[62] Division of Ser. No. 830,857, Feb. 19, 1986, Pat. No. 4,692,206.

[30] Foreign Application Priority Data

Feb. 19, 1985 [JP] Japan .................................. 60-33601

[51] Int. Cl.⁴ .................................................. H01S 3/19
[52] U.S. Cl. ........................................ 372/46; 357/17
[58] Field of Search ...................... 372/43, 44, 45, 46; 357/17

[56] References Cited

U.S. PATENT DOCUMENTS 4,470,143 9/1984 Kitamura et al. ...................... 372/50
4,597,085 6/1986 Mito et al. ............................ 372/45

FOREIGN PATENT DOCUMENTS 0087253 2/1983 European Pat. Off. .
0021587 2/1985 Japan .................................... 372/46
0034088 2/1985 Japan .................................... 372/46

OTHER PUBLICATIONS

Applied Physics Letters, vol. 39, No. 5, 1st Sep. 1981, pp. 376-378, American Inst. of Physics–Van Der Ziel et al.
Patent Abstracts of Japan, vol. 6, No. 147, Aug. 6, 1982.

*Primary Examiner*—James W. Davie
*Attorney, Agent, or Firm*—Birch, Stewart, Kolasch & Birch

[57] ABSTRACT

A semiconductor laser device having a buried heterostructure which includes a multi-layered crystal structure, containing an active layer for laser oscillation, on a substrate, said multi-layered crystal structure having a striped mesa-portion, a multi-layered structure surrounding said mesa-portion and a burying layer disposed on an upper face of said striped mesa-portion. The unique structure results in a heterojunction at each side of the active layer.

13 Claims, 1 Drawing Sheet

SEMICONDUCTOR LASER DEVICE HAVING A BURIED HETEROSTRUCTURE

This application is a divisional of copending application Ser. No. 830,857, filed on Feb. 19, 1986, U.S. Pat. No. 4,692,206.

BACKGROUND OF THE INVENTION

1. Field of the invention:

This invention relates to a method for the production of semiconductor laser devices, especially those having a buried heterostructure therein.

2. Description of the related art:

Semiconductor laser devices, which comprise a buried heterostructure resulting from surrounding the active layer for laser oscillation with a heterojunction, have excellent device characteristics in that provide for stabilized laser oscillation which can be attained in a transverse mode and a low oscillation threshold current level which can be maintained, and thus they are usable as laser light sources.

In a conventional semiconductor laser device having a structrue such as that shown in FIG. 2, in which a p type crystal 10 is employed as a substrate for epitaxial crystal growth, the p-n junction of a current confining region has to withstand voltage at a high level, so that a high output power operation can be achieved by the application of a high voltage. This conventional semiconductor laser device is produced as follows: On the p-InP substrate 10, a p-InP buffer layer 20, a non-doped InGaPAs active layer 30, and an n-InP cladding layer 40 are successively grown by liquid phase epitaxy. Both sides of the resulting multi-layered crystal structure are then etched in a manner to reach the buffer layer 20. On the post-etched portion, an n-InP current blocking layer 50 and a p-current confining layer 60 are grown as burying layers. According to the structure of the above-mentioned device, in order to block the electroconductivity between the cladding layer 40 and the current blocking layer 50, the top of the current blocking layer 50 must be positioned below the active layer 30. For this reason, both the depth of etching in the multi-layered crystal structure and the growth thickness of the current blocking layer 50 must be regulated with high precision. However, neither liquid phase epitaxy nor a wet-etching technique can attain such precise regulation, resulting in a low production yield of semiconductor laser devices of this type.

SUMMARY OF THE INVENTION

The method for the production of semiconductor laser devices of this invention which overcomes the above-discussed and numerous other disadvantages and deficiencies of the prior art, comprises (1) growing a multi-layered crystal structure, containing an active layer for laser oscillation, on a p-substrate, (2) etching said multi-layered crystal structure to form a striped mesa-portion, and (3) surrounding said mesa-portion of the multi-layered crystal structure with a p-n-p multi-layered structure, resulting in a heterojunction at each of both side faces of said active layer.

The multi-layered crystal structure comprises, in a preferred embodiment, a p-buffer layer, a non-doped active layer, and an n-cladding layer, in sequence, on the p-substrate.

The multi-layered crystal structure is, in a preferred embodiment, etched in the range of the upper face thereof to the middle of the p-buffer layer.

The p-n-p multi-layered structure comprises, in a preferred embodiment, a p-buffer layer, an n-current blocking layer and a p-current confining layer, in sequence. The p-buffer layer of said p-n-p multi-layered structure electrically separates the n-current blocking layer from the cladding layer of the striped mesa-portion. The p-buffer layer of said p-n-p multi-layered structure is, in a preferred embodiment, a layer, the forbidden band width of which is greater than that of the active layer and the refraction index of which is smaller than that of the active layer.

The invention described herein makes possible the object of providing a method for the production of semiconductor laser devices by which semiconductor laser devices having a buried structure can be readily produced without a crystal growth process and an etching process under a highly precise regulation, and thus the production yield thereof can be increased.

BRIEF DESCRIPTION OF THE DRAWINGS

This invention may be better understood and its numerous objects and advantages will become apparent to those skilled in the art, by reference to the accompanying drawings as follows.

DESCRIPTION OF THE PREFERRED EMBODIMENTS

Figure 1A:
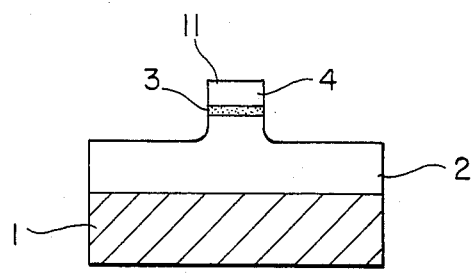
FIGS. 1(A) and 1(B) are diagrammatical views showing the production process of a semiconductor laser device according to a preferred embodiment of the present invention.
Figure 1B:
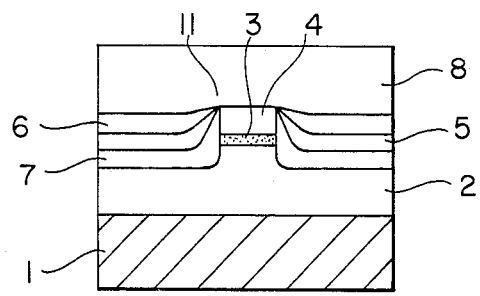
Figure 2:
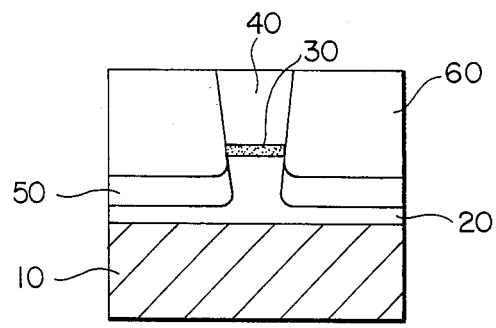
FIG. 2 is a sectional view showing a conventional semiconductor laser device having a buried heterostructure.

FIGS. 1(A) and 1(B) show the production process of a semiconductor laser device according to a preferred embodiment of the present invention. As shown in FIG. 1(A) on a p-(100)InP substrate 1, a p-InP buffer layer 2 having a thickness of 3 $\mu$m, a non-doped InGaPAs active layer 3 having a radiation wavelength of 1.3 $\mu$m and a thickness of 0.2 $\mu$m, and an n-InP cladding layer 4 having a thickness of 0.5 $\mu$m are successively grown by liquid phase epitaxy. On the cladding layer 4, a photo-resist stripe (not shown) having a width of approximately 3 $\mu$m is then formed in the (011) direction by photolithography. The multi-layered crystal structure is then subjected to an etching treatment with a Br-methanol solution in the range of the upper face thereof to the middle of the buffer layer 2, resulting in a striped mesa-portion 11. When the striped mesa-portion 11 is designed with a stripe width W of 2–4 $\mu$m and a height h of 2 $\mu$m, the crystal growth can be prevented from proceeding over the mesa-portion 11 in the succeeding burying-growth process (Mito el al., TGOQE 80-116). The burying growth process is then carried out as shown in FIG. 1(B) in such a manner that a p-InP buffer layer 7 (the plane portion thereof having a thickness of 0.5 $\mu$m), an n-InP current blocking layer 5, a p-InP current confining layer 6 (the plane portion thereof having a thickness of 0.5 $\mu$m), and an n-InP burying layer 8 (the plane portion thereof having a thickness of 3 $\mu$m) are successively grown along the striped mesa-portion 11 by liquid phase epitaxy. Then, an n-sided ohmic electrode (not shown) and a p-sided ohmic electrode (not shown) are formed on the InP burying layer 8 and the substrate 1, respectively, followed by cleaving at the (011) face, resulting in a semiconductor laser device.

In the semiconductor laser device having the above-mentioned structure, the InGaPAs active layer 3 for laser oscillation has a junction at the interface with each of the InP buffer layer 2 and the InP cladding layer 4 in the thickness direction thereof and has a junction at the interface with the InP buffer layer 7 at each of both sides thereof, resulting in an active region which is limited to a striped form by the said heterojunctions. Since the buffer layer 7 tends to be grown on the sides of the striped mesa-portion 11, the sides of both the cladding layer 4 and the active layer 3 are covered with the p-InP buffer layer 7 so that the cladding layer 4 is electrically separated from the current blocking layer 5 and leakage current never arises between the cladding layer 4 and the current blocking layer 5. Moreover, since the carrier concentration of the buffer layer 7 is selected to be at a low level, the buffer layer 7 functions as an insulating layer which prevents leakage current from the cladding layer 4 to the current blocking layer 5. Moreover, since the forbidden band width of the buffer layer 7 is greater than that of the active layer 3 and the refraction index is smaller than that of the active layer 3, it functions to confine carrier and light within the active layer 3.

When a driving current is injected into the semiconductor laser device through the n-sided ohmic electrode and the p-sided ohmic electrode, the current flows into the electroconductive region corresponding to the striped mesa-portion 11 including the cladding layer 4 and the active layer 3 therein and is blocked from flowing outside of the striped mesa-portion 11 by the p-n-p multi-layered structure which is composed of the current confining layer 6, the current blocking layer 5 and the buffer layer 7. The carrier and light are confined within the active layer 3 by the junction at the interface between the buffer layer 7 and the active layer 3. The top of each p-n junction in the p-n-p multi-layered structure is positioned at the shoulder portion of the cladding layer 4 and the lower portion thereof is curved toward the lateral direction. This is because the buffer layer 7 is grown in the lateral direction during its epitaxial growth around the striped mesa-portion 11 and, on the buffer layer 7 which functions as an underlying layer, the current blocking layer 5 and the current confining layer 6 are successively formed. Because of the above-mentioned structure, a current with a high density can be fed to the active layer 3, and the semiconductor laser device obtained exhibits excellent device characteristics since it can oscillate at a low oscillation threshold current level in the range of 15 to 20 mA at ambient temperature and the characteristic temperatures of the oscillation threshold current are 70 K or higher up to a temperature of about 100° C. Moreover, since the depth of etching and the thickness of crystal growth layers are not required to be regulated with accuracy, the production yield is greatly improved.

The above-mentioned example discloses only the InGaPAs system materials, as an active layer, which exhibit a radiation wavelength of 1.3 μm, but is not limited thereto. This invention is, of course, applicable to other InGaPAs system materials which have a radiation wavelength ranging from 1.1 μm to 1.7 μm, and/or other semiconductor materials, as well. All of the four layers constituting the buried structure in the above-mentioned example are composed of InP, but they can be InGaPAs, the forbidden band width of which is greater than that of the active layer and the refraction index of which is smaller than that of the active layer.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser device having a structure comprising:
   a multi-layer crystal structure which includes a striped mesa-portion disposed on a substrate, said striped mesa portion having an active layer for laser oscillation;
   a three-layer structure formed on said multi-layer crystal structure, said three-layer structure including
      a first semiconductor layer of a first conductivity type formed over the entirety of an upper face of said multi-layer crystal structure except for an upper face of said striped mesa-portion, wherein said first semiconductor layer is formed at both sides of said striped mesa-portion so as to form a heterojunction at each side of said active layer,
      a second semiconductor layer of a second conductivity type opposite to the first conductivity type formed on an upper face of said first semiconductor layer, and
      a third semiconductor layer of the first conductivity type formed on an upper face of said second layer; and
   a burying layer of the second conductivity type formed on said upper face of said striped mesa-portion and an upper face of said third semiconductor layer.

2. A semiconductor laser device according to claim 1, wherein said multi-layer crystal structure comprises
   a first buffer layer of the first conductivity type formed on said substrate,
   an active layer formed on said first buffer layer, wherein said active layer is non-doped, and
   a cladding layer of the second conductivity type formed on said active layer.

3. A semiconductor laser device according to claim 2, wherein an upper portion of said first buffer layer forms a bottom portion of said striped mesa-portion.

4. A semiconductor laser device according to claim 2, wherein said first semiconductor layer is a second buffer layer, said second semiconductor layer is a current blocking layer, and said third semiconductor layer is a current confining layer.

5. A semiconductor laser device according to claim 4, wherein said second buffer layer electrically separates said current blocking layer from said cladding layer of said striped mesa-portion.

6. A semiconductor laser device according to claim 5, wherein said second buffer layer has a forbidden band width which is greater than that of said active layer and a refraction index which is smaller than that of said active layer.

7. A semiconductor laser device according to claim 3, wherein said first semiconductor layer is a second buffer layer, said second semiconductor layer is a current blocking layer, and said third semiconductor layer is a current confining layer.

8. A semiconductor laser device according to claim 7, wherein said second buffer layer electrically separates said current blocking layer from said cladding layer of said striped mesa portion.

9. A semiconductor laser device according to claim 8, wherein said second buffer layer has a forbidden band width which is greater than that of said active layer and a refraction index which is smaller than that of said active layer.

10. A semiconductor laser device according to claim 9, wherein the radiation wavelength of said active layer ranges from 1.1 to 1.7 microns.

11. A semiconductor laser device according to claim 9, wherein said active layer comprises InGAPAs and wherein said substrate, said first and second buffer layers, said current blocking layer, said current confining layer, said burying layer, and said cladding layer comprise InP.

12. A semiconductor laser device according to claim 9, wherein said substrate said first and second buffer layers, said current blocking layer, said current confining layer, said burying layer, and said cladding layer comprise InGaPAs.

13. A semiconductor laser device according to claim 9, further comprising first and second electrodes formed on said burying layer and said substrate.

* * * * *